United States Patent [19]

Elnathan

[11] Patent Number: 5,689,256

[45] Date of Patent: Nov. 18, 1997

[54] TREE DECODER

[76] Inventor: Nathan Elnathan, 9 Pines St., Rehovot, Israel

[21] Appl. No.: 510,168

[22] Filed: Aug. 2, 1995

[51] Int. Cl.⁶ .................................................. H03M 7/40
[52] U.S. Cl. .................................................. 341/79; 341/65
[58] Field of Search .................................. 341/65, 67, 79

[56] References Cited

U.S. PATENT DOCUMENTS 3,918,047  11/1975  Denes .................................. 341/67
4,853,696   8/1989  Mukherjee ........................... 341/65

Primary Examiner—Howard L. Williams

[57] ABSTRACT

Apparatus for decoding information which has been coded with a tree code including a tree decoder. The tree decoder includes a tree input port at which a token enters the tree decoder, a plurality of tree output ports from one of which the token exits the tree decoder and a plurality of nodes forming a tree connected between the tree input port and the tree output ports. Each of the nodes includes an token input port, two token output ports, a code input port and apparatus for operating the node in a first mode wherein the token passes from the token input port to one of the token output ports in response to the code input and in a second mode wherein the token passes from the token input port to one of the output token ports independent of the code output.

13 Claims, 11 Drawing Sheets

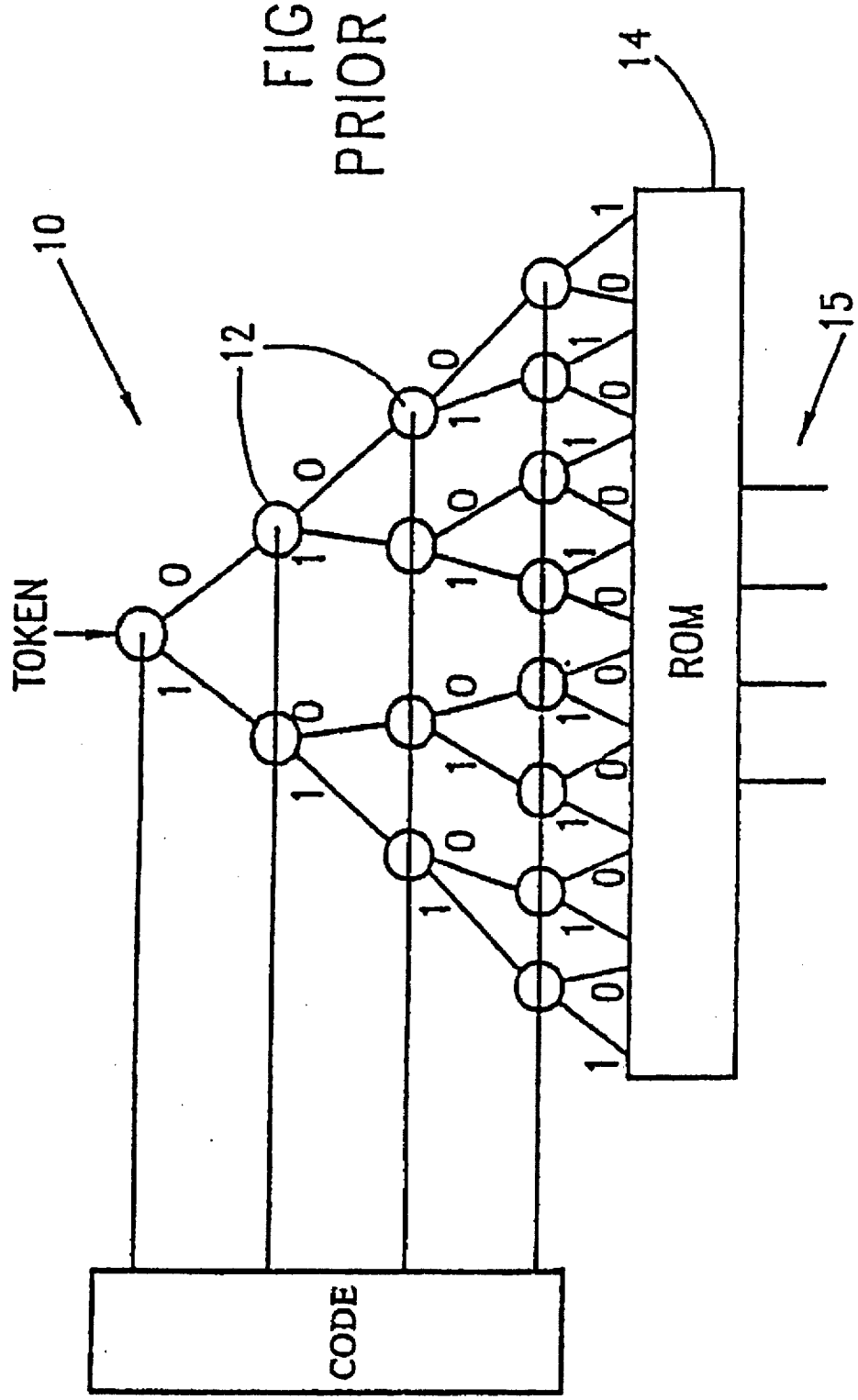

PRIOR ART

A : 1 0 1 1
B : 1 0 1 0
C : 1 0 0
D : 1 1 0
E : 1 1 1
F : 0

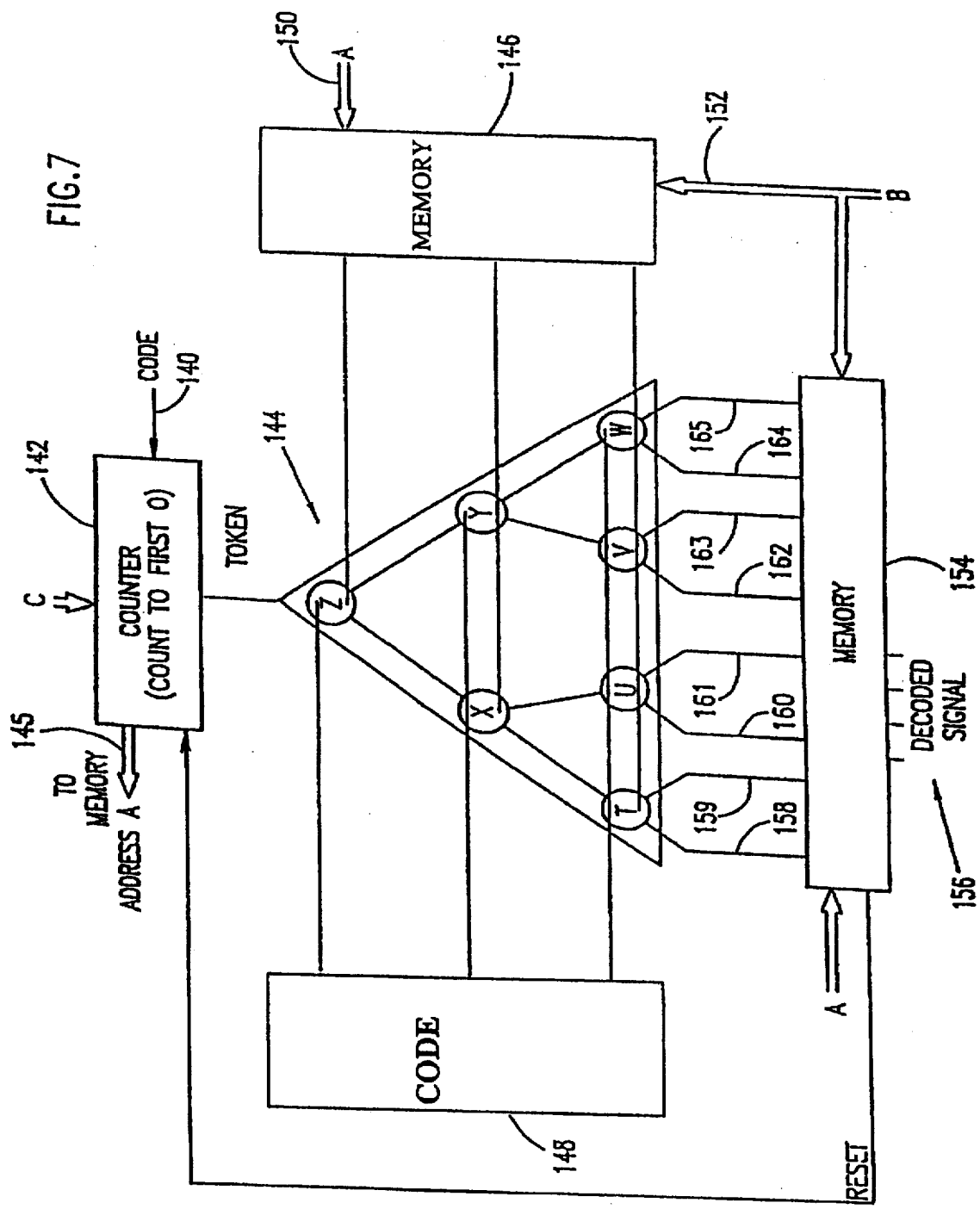

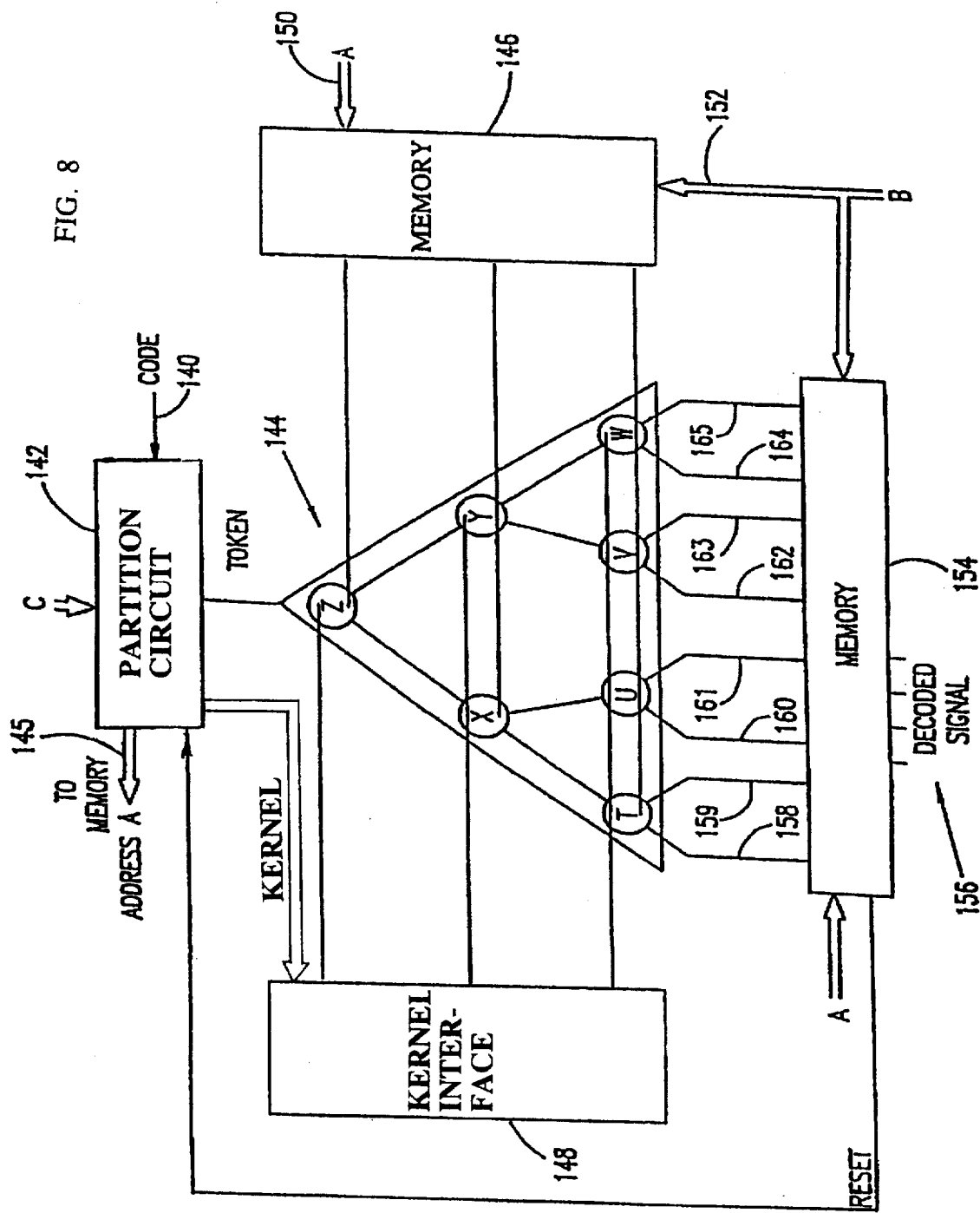

TREE DECODER

FIELD OF THE INVENTION

The present invention relates to tree decoders and more particularly to hardware decoders for tree coded signals especially those coded with a Hufman code.

BACKGROUND OF THE INVENTION

Tree codes are in wide use for compressing images and other information streams. These codes generally provide a variable length code word for each information element or group of elements in the image or information stream.

While, in general the longest possible code word has more bits than the information element itself, compression is secured by assigning the shorter code words to the most probable values for the information element and the longer code words to the least probable values. Thus, in coding certain types of images, for example images with smooth areas, compression can be fairly high. In addition, such codes are especially useful when used as a final coding step with other compression methods.

In general, fast coding and decoding is required for such systems and software decoding is generally too slow for many uses.

In a paper entitled "Efficient VLSI Designs for Data Transformation of Tree-Based Codes" by A. Mukherjee et al, IEEE Trans. Circuits and Systems Vol. 38, No. 3, March 1991, the disclosure of which is incorporated herein by reference, the authors present theory and VLSI implementation of a method for coding and decoding in Hufman code. They also present a tree based coding and decoding structure which can be utilized in a VLSI implementation.

One of the problems with this and other decoders is the large number of gates which are need for the decoding operation and the lack of flexibility when the code is changed.

SUMMARY OF THE INVENTION

One object of a preferred embodiment of the invention is to provide a tree decoder especially suitable for large codes, which has fewer elements than prior hardware decoders.

An object of some embodiments of the invention is to provide a standard decoder suitable for various length Hufman codes which can be easily programed and which operates with an optimal speed for each code length.

In one preferred embodiment of the invention a decoding tree formed of nodes is provided. Each node in the tree is addressed sequentially by the bits in the code. A token, which can be, for example, a voltage pulse, enters the tree at a given input port and passes through the nodes to exit the tree at one of a plurality of exit ports. In the preferred embodiment of the invention, the nodes can operate in two modes. In one mode the token passes from a node input port to one of the node output ports depending on the bit of the code which addresses the node when the token enters the node. In one preferred embodiment of the invention this passage of the token takes one clock period. In a second mode, the token passes from the input port of the node to one of the output ports without delay, independent of the code.

Alternatively the nodes in the tree are addresses in parallel by the bits in the code and the token passes immediately to one of the outputs substantially without delay. This alternative embodiment is especially suitable for parallel code transmission.

Preferably, the nodes have a mode control port. The value of the input at the mode control port determines the operating mode of the node. The values at the mode switching port can, preferably, be varied such that the tree decodes the coded information in accordance with the tree code with which the information was initially coded. Depending on the code used to encode the information and the control values, the output port of the tree at which the token exits corresponds to the uncoded information. In a preferred embodiment of the invention, a translation table such as a memory is provided to translate the output port into decoded information.

Tree codes generally have a first portion, termed herein a "prefix" which consists of a string of bits of a first value (1 or 0), optionally followed by a single bit of the other value (0 or 1). The string can have a length varying from zero bits to a maximum value which depends on the code used.

In a second preferred embodiment of the invention a counter is used to count the length of the prefix for each coded word. This counter counts up to one less than the maximum length of the prefix. When the counter reaches either the end of the prefix or one less than the maximum length of the prefix a token is generated which enters a decoding tree similar to that of the first embodiment of the invention described above. Based on the prefix length which is determined by the counter, mode control values are set for the individual nodes in the tree which optimally finish the decoding of the coded word. The translation table is also set in accordance with the prefix length to give the correct uncoded information. In a variant of this preferred second preferred embodiment of the invention, the coded information is received in parallel form. In this case a partition circuit receives the code and determines the length of the prefix. The kernel of the code is applied in parallel to respective levels of the decoding tree. In this case the nodes are made operative to pass the token from level to level without waiting for any clocks.

In this second preferred embodiment of the invention not only is a the same decoder used for all tree codes, but the number of levels in the tree is only equal to the maximum number of bits after the prefix (termed herein the "kernel") which is a much smaller number, generally, than the maximum number of bits in the code. Since the number of bits in each level is $2^n$, this results in a large saving in electronics. This feature is in addition to the flexibility which is available from the first embodiment of the invention.

There is therefore provided in accordance with a preferred embodiment of the invention apparatus for decoding information which has been coded with a tree code including:

a tree decoder having:
  a tree input port at which a token enters the tree decoder;
  a plurality of tree output ports from one of which the token exits the tree decoder; and
  a plurality of nodes forming a tree connected between the tree input port and the plurality of tree output ports, each of the nodes comprising:
    an token input port;
    two token output ports;
    a code input port; and
apparatus for operating the node in a first mode wherein the token passes from the token input port to one of the token output ports in response to code input at code input port and a second mode wherein the token passes from the input port to one of the output ports independent of the code input.

In a preferred embodiment of the invention the decoder operates according to a cycle time and wherein, in the first mode of operation, the token passes through the node in one cycle time and wherein, in the second mode of operation the token passes through the node in a period substantially less than one cycle time. Alternatively, the code information is received serially and the token passes through the node substantially without delay.

Preferably the decoding apparatus includes apparatus for generating a decoded signal responsive to the particular tree output port at which the token exits the tree decoder. Preferably the apparatus for generating includes apparatus for producing the decoded signal in response to the particular tree code used to code the information.

In a preferred embodiment of the invention the apparatus for generating includes at least one table for determining the decoded signal and apparatus for changing the table responsive to the particular tree code used to code the information.

In a preferred embodiment of the invention the apparatus for operating includes apparatus for providing separate control signals to each of the plurality of nodes whereby the node are selectively operated in the first or second modes. Preferably the apparatus for providing includes apparatus for producing the separate control signal responsive to the particular tree code used to code the information.

In a preferred embodiment of the invention, the coded information is in the form of a first series of bits of a given value optionally concluded by one bit of the other value, followed by a second series of bits and also including means for determining the number of bits in the first series, and the apparatus for generating includes apparatus for producing the decoded signal in response to the particular tree code used to code the information and the number of bits in the first series.

Preferably the apparatus for operating includes apparatus for providing separate control signals to each of the plurality of nodes whereby the node are selectively operated in the first or second modes and wherein the apparatus for providing includes apparatus for producing the separate control signal responsive to the particular tree code used to code the information and to the length of the first series.

Other objects and aspects of the invention will become clear upon consideration of the detailed description of the following non-limiting preferred embodiments of the invention in which:

BRIEF DESCRIPTION OF THE DRAWINGS

FIG. 1 is a schematic drawing of a tree decoder in accordance with the prior art;

FIG. 7 is a simplified schematic representation of an alternative embodiment of a decoder in accordance with a preferred embodiment of the invention;

FIG. 8 is a simplified schematic representation of an alternative embodiment of the decoder of FIG. 7, suitable for parallel decoding.

DETAILED DESCRIPTION OF THE PREFERRED EMBODIMENTS

Figure 9:
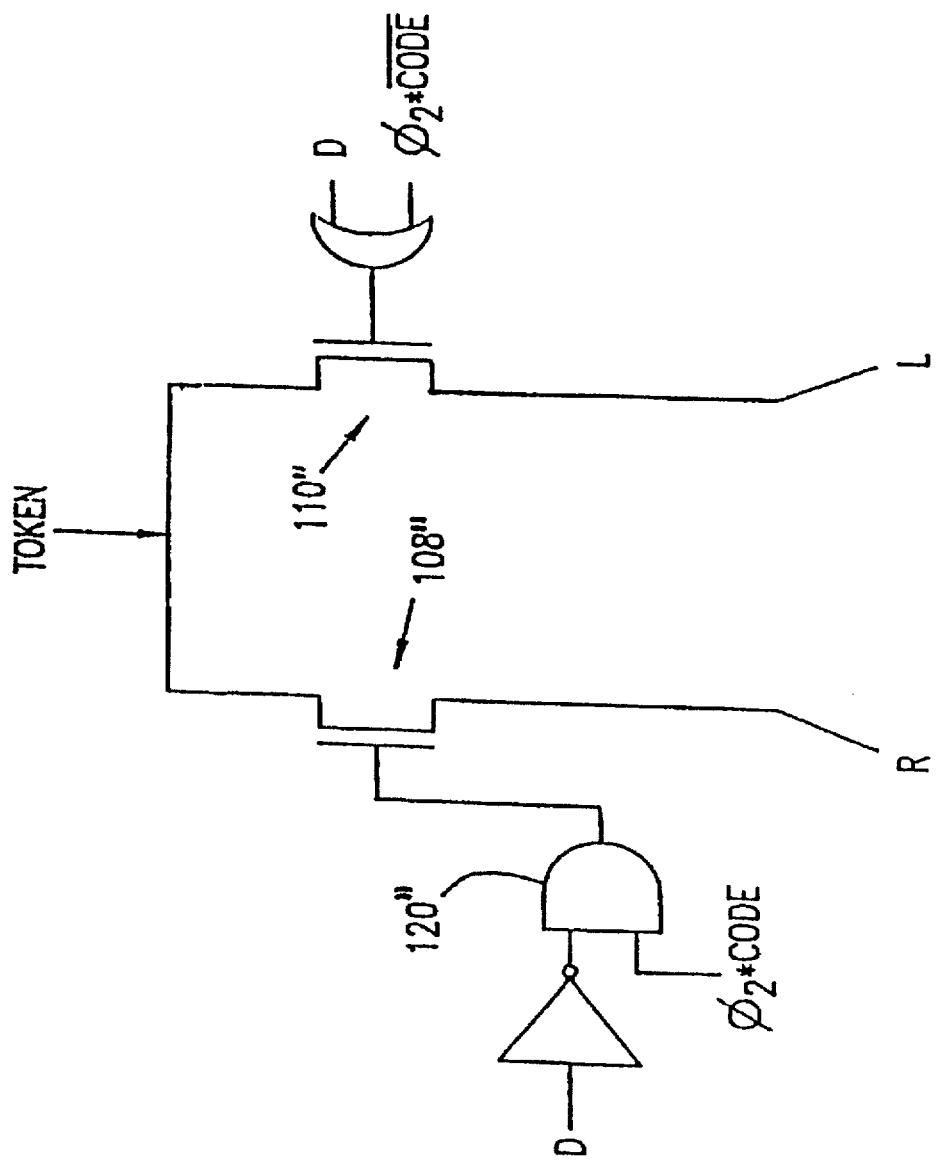
FIG. 9 is an alternative node circuit for use in parallel decoders such as that of FIG. 8.

FIG. 1 shows a logical design of a Hufman decoder for a code having 4 bits. In this design a token, which can be, for example, a voltage pulse, is inserted into a logical tree 10 having logic elements 12 which will be described in more detail below. The bits of the Hufman code to be decoded are sequentially fed to the various levels of the tree. That is to say, the first bit of the code is fed to all of the gates and then the second bit is fed to all of the gates, etc. A Read Only Memory (ROM) 14 receives the token at one of its inputs and generates the uncompressed, generally fixed length, code at output 15. Alternatively, the modified hardware design described in conjunction with FIG. 9 of the Mukherjee paper is used to produce the code.

Figure 2A:
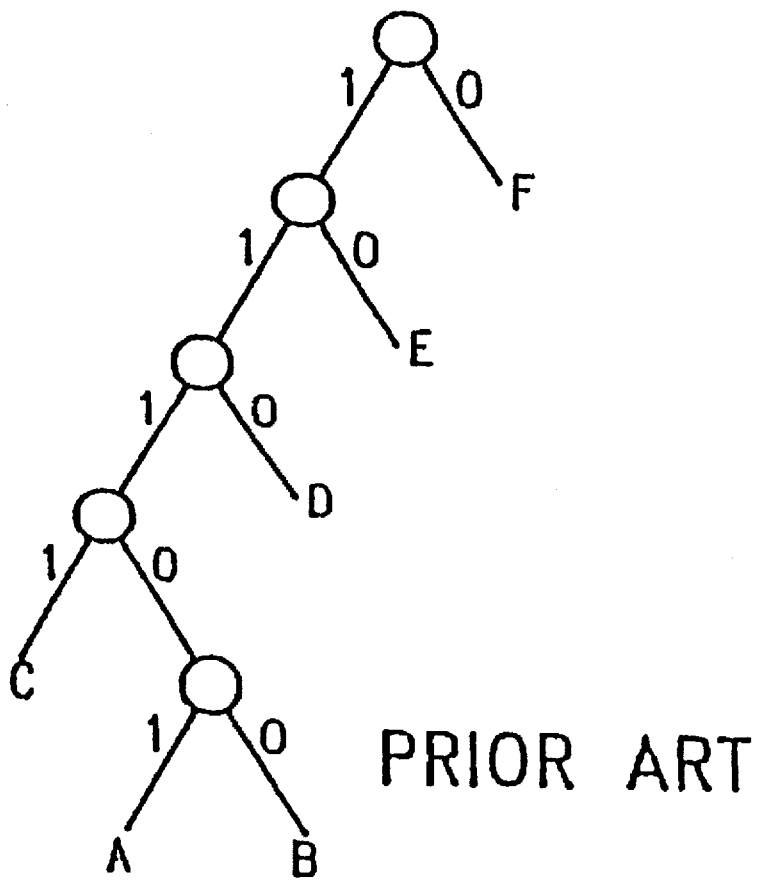
FIGS. 2A and 2B are tree decoders for particular examples of tree code.
Figure 2B:
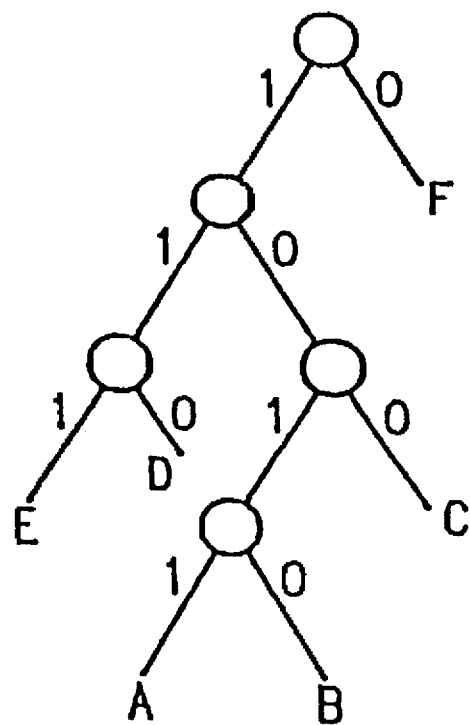

In general fewer nodes are required than shown in FIG. 1, since, by the nature of the code, many of the combinations are not possible. In one example described in Mukherjee the six letters (A,B,C,D,E,F) appear with a frequency (1,1,4,4,7,14). The optimum Hufman code and Hufman tree for this example is shown in FIG. 2A. If the frequency of occurrence is changed to (1,3,4,4,7,14) then the optimum code is shown in FIG. 2B. In the prior art these different codes require different decoding hardware. While Mukherjee describes a method for online adaptive coding of compression hardware, the receiver of the information would require apparatus for decoding the adaptively coded signals.

Figure 3A:
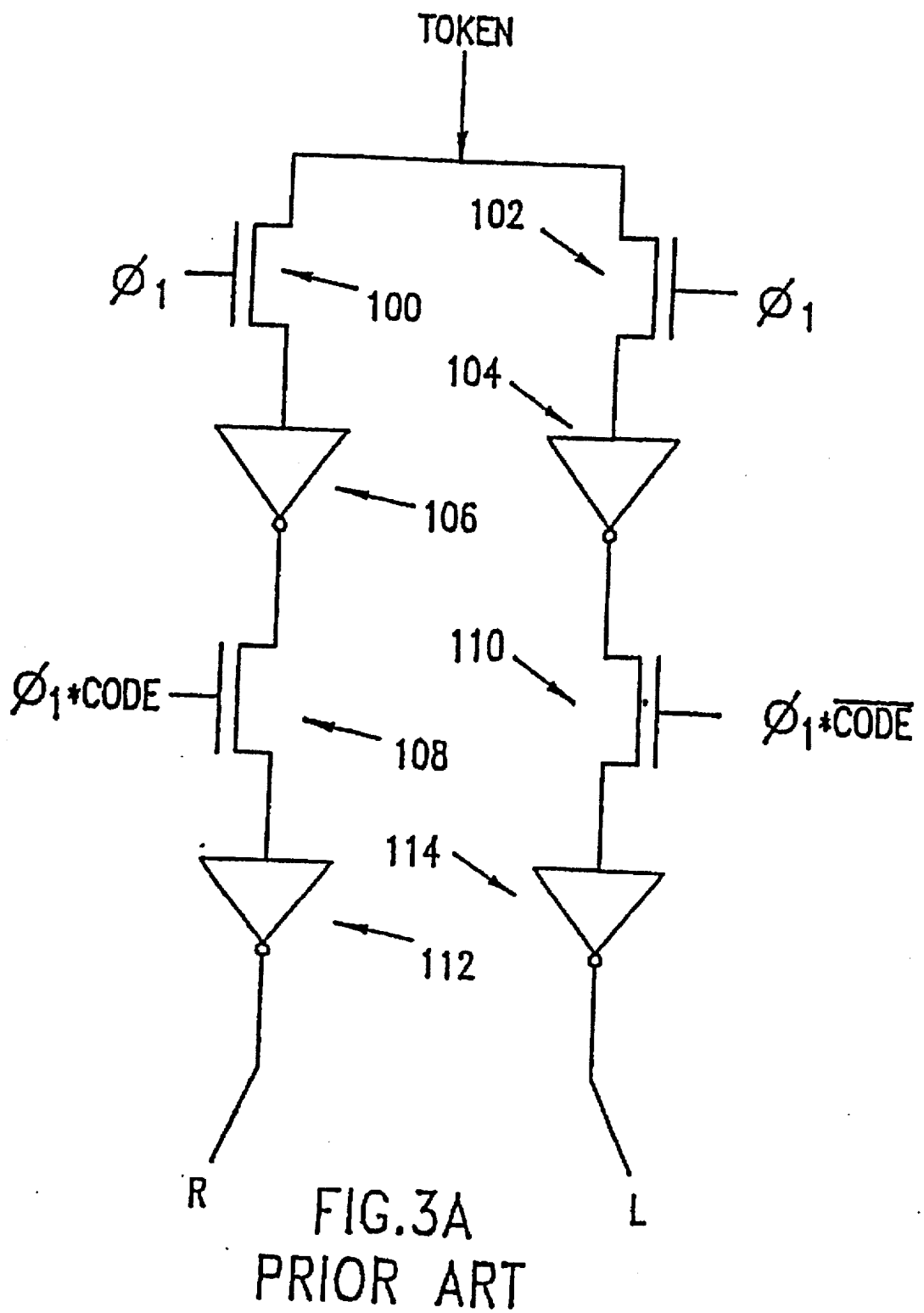
FIG. 3A is a simplified schematic diagram of a node for a tree decoder in accordance with the prior art.

In a first embodiment of the present invention, a new node element is preferably used. FIG. 3A shows a node element for decompression as described in conjunction with in FIG. 8 of the Mukherjee paper. In this embodiment $\phi_1$ is the system clock and $\phi_2$.code is a non-overlapping phase clock coded with the Hufman coded input. During the $\phi_1$ clock the token passes gates 100 and 102 and is inverted by inverters 104 and 106. At $\phi_2$ the token will pass either to the left or right leg of the node depending on whether the code is 1 or 0. If the code is 1 gate 108 is open during the $\phi_2$ pulse and gate 110 is closed since its gate voltage is zero. In this case, inverter 112 passes the inverted signal to the left. If the code is zero, then gate 108 is closed, gate 110 is open and the token passes via inverter 114 to the right.

Figure 3B:
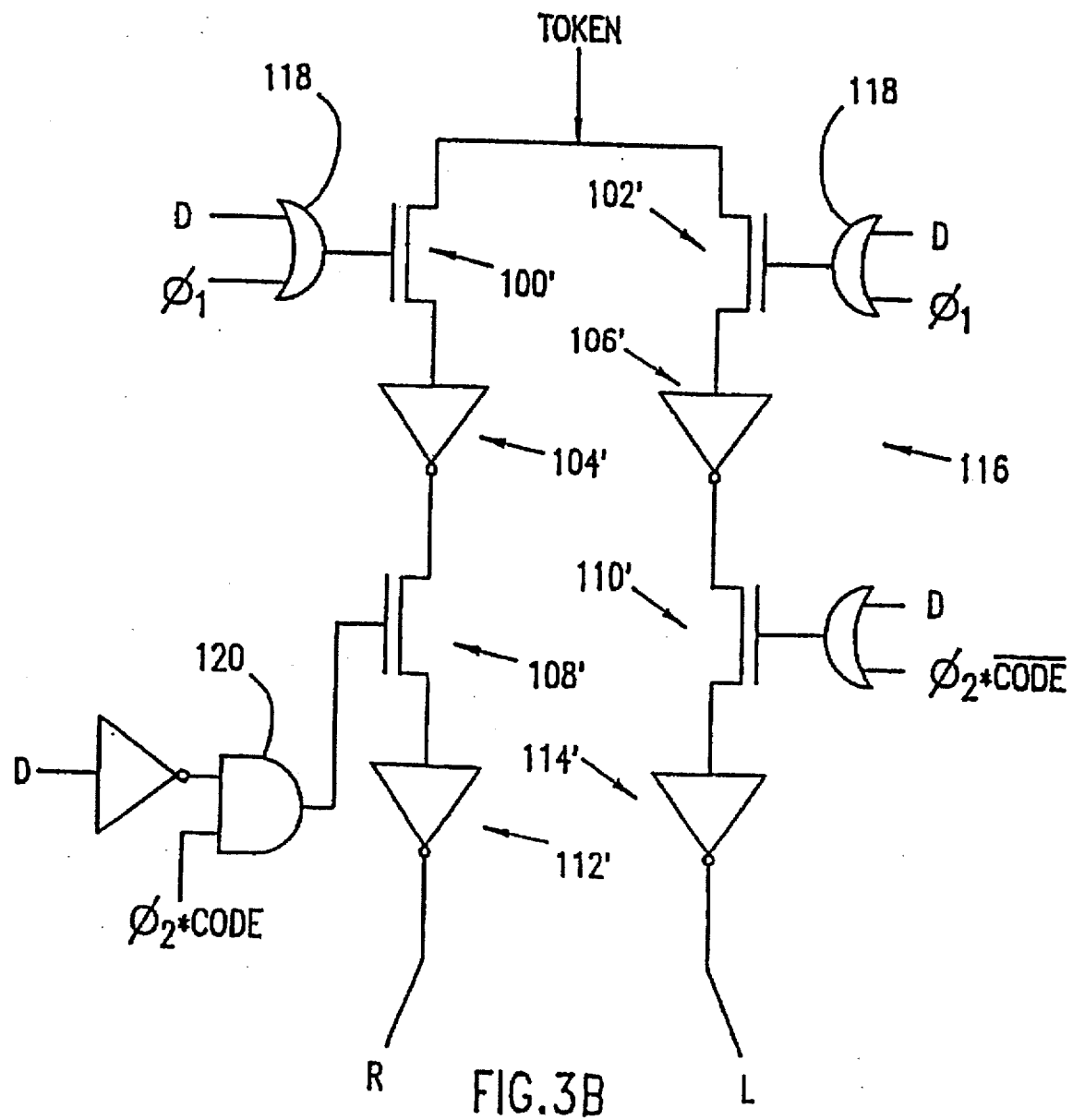
FIG. 3B is a simplified schematic diagram of a node for a tree decoder in accordance with a preferred embodiment of the invention.

In an improved node 116, in accordance with a preferred embodiment of the present invention, shown in FIG. 3B, the node operates in an "operative" mode or in a "shorted" mode. In the operative mode, node 116 is functionally the same as the node element of FIG. 3A and the token passes to either the right or left during one cycle. In the shorted mode the node operates as a short circuit and passes the token to the right leg immediately, and not at the end of the cycle.

In the operative mode, a mode control value, D, is 0. Gates 100' and 102' are switched, via an "or" gate 118, by the D signal and $\phi_1$. Thus, if D is 0, the switching signal for gates 100' and 102' is effectively equal to $\phi_1$. Gate 108' is switched, via an "and" gate 120, by the inverse of D and $\phi_2$.code. Since D is 0, the switching signal for gate 108' is effectively $\phi_2$. Gate 110' is driven, via an "or" gate 122, by the D signal and $\phi_2$.(inverse of code). Since D is 0, the effective value driving gate 110' is $\phi_2$.(inverse of code).

In the shorted mode, D is 1. Thus gates 100' and 102' are always shorted, gate 108' is always open and gate 110' is always shorted. The status of these gates is not dependent on the clocks and the signal passes through the node without delay.

Figure 4:
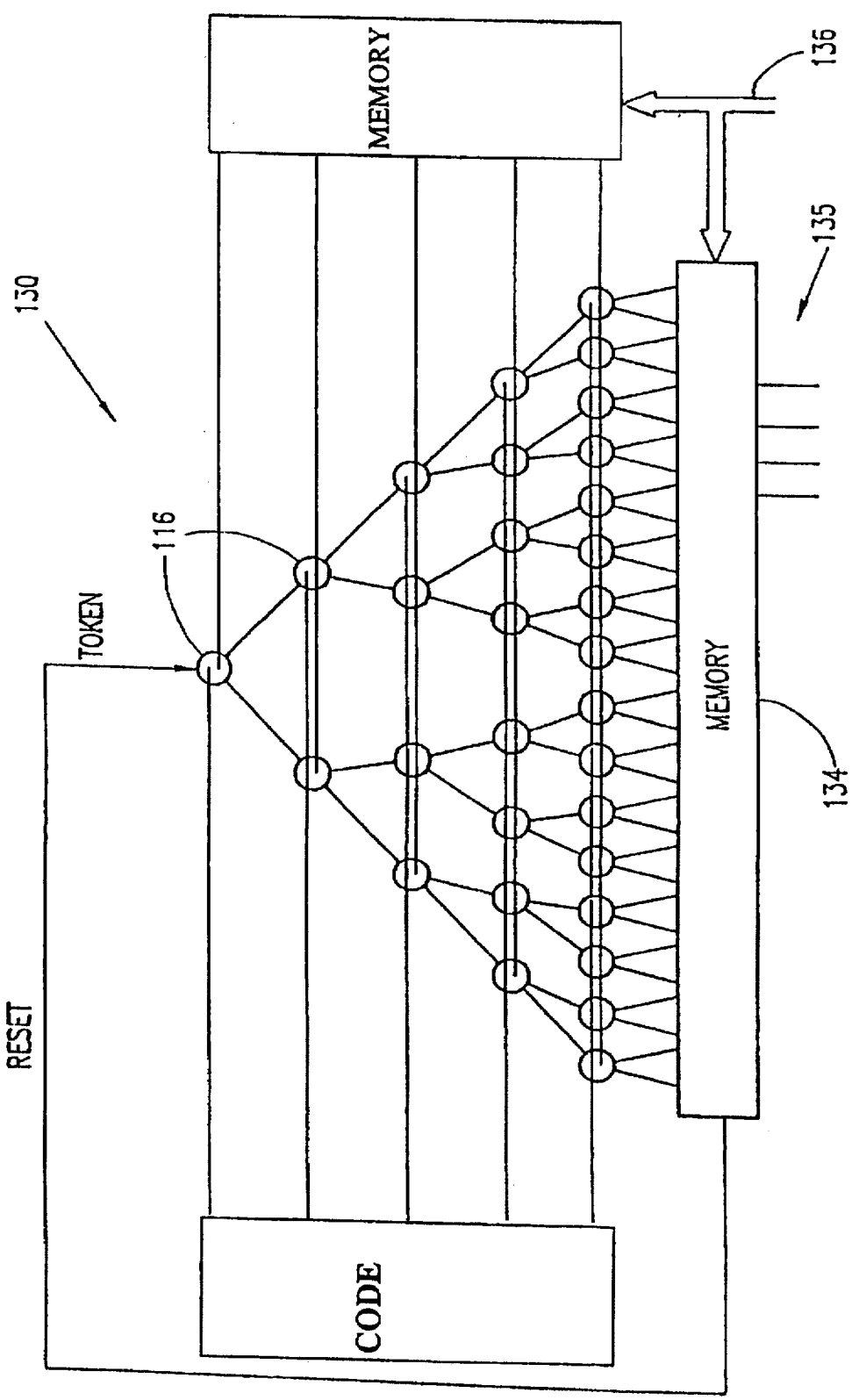
FIG. 4 is a simplified schematic diagram of a decoding system in accordance with a preferred embodiment of the invention.

FIG. 4 shows a schematic representation of a decoder 130 in accordance with a preferred embodiment of the invention. Decoder 130 has a number of node levels equal to the largest number of bits in the coded signal. The values for D are supplied by a memory 132. The token, after passing through decoder 130, is fed to a particular input of a memory 134, where it acts as an address for a translation table stored in memory 134. An output 135 of table 134 is the decoded information. It is a feature of a preferred embodiment of the invention that, while the number of node levels is n, the time for decoding depends on the number of bits in the particular code which is being decoded.

Figure 5A:
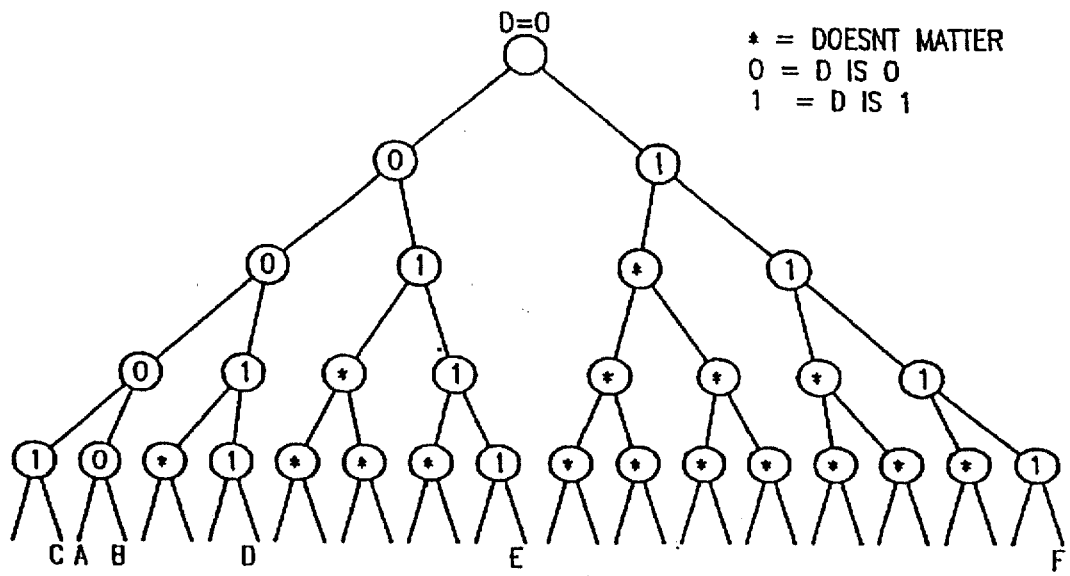
FIGS. 5A and 5B are logical trees of configurations of tree decoder of FIG. 4 for the particular examples of FIGS. 2a and 2B respectively.
Figure 5B:
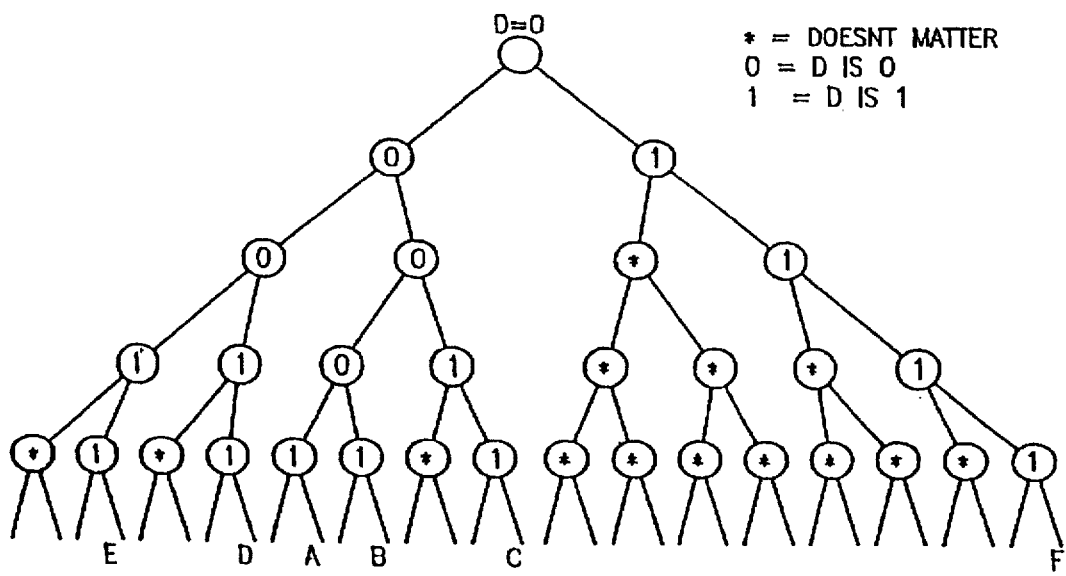

For simplicity, the particular examples shown in FIG. 2 are used. Assume that the maximum code length is 5 bits. In this embodiment of the invention, the decoder would then have 5 levels. For the case of the Hufman code shown in FIG. 2A, the values of D are shown in the tree of FIG. 5A. For the code of FIG. 2B, the code for D is indicated in FIG. 5B. It is clear that by changing the values of D, the circuit of FIG. 4 has been made to simulate the tree of either FIG. 2A or FIG. 2B.

If a limited number of codes are to be used, then memories 132 and 134 can be ROMs and an input 136 is provided to the ROMs for choosing the proper tables to be used for the particular code. If a more flexible system is desired, then the memories may be, for example, RAMs or Read Mostly Memories and the input would, for example, be the tables to be used for decoding.

Figure 6A:
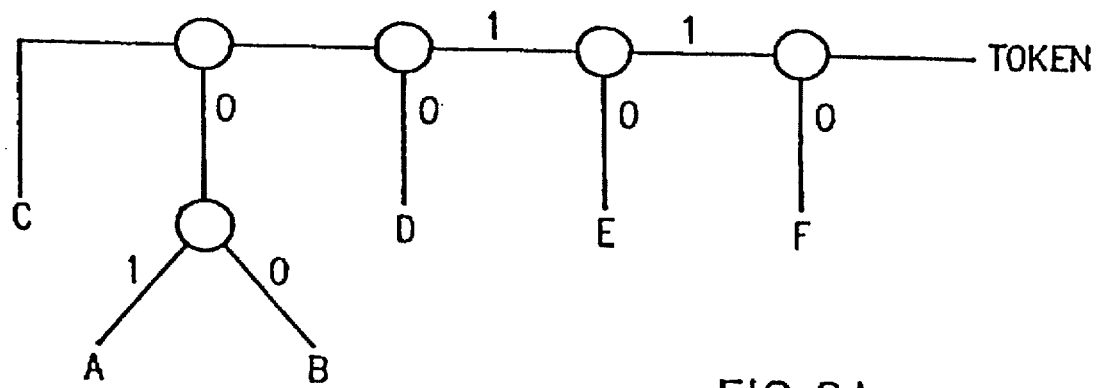
FIGS. 6A and 6B are reoriented versions of the trees of FIGS. 2A and 2B respectively.
Figure 6B:
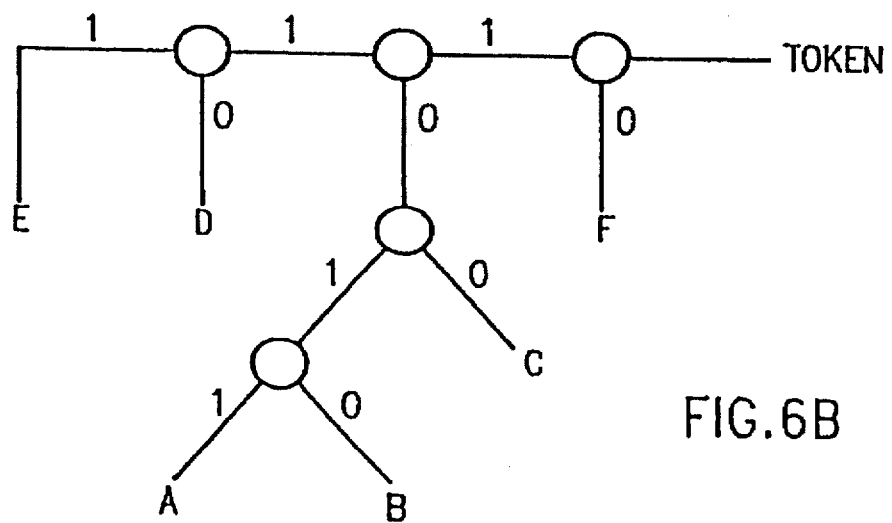

A closer study of the Hufman codes shown in FIG. 2 shows that in both cases there is a regularity in the structure. This structural regularity can be more clearly seen, by reorienting the tree, so that the token is fed from the upper right hand corner as shown in FIGS. 6A and 6B. Furthermore, this structural regularity is closely associated with what I will refer to as the "prefix" and "kernel" of the code. Most tree codes, including the Hufman code can be divided into a prefix which consists of a series of ones or zeros followed by a zero or a one. Table 1 shown the prefix and kernels of the codes of FIGS. 2A and 2B.

TABLE I

| CODE OF FIG. 2A | | | CODE OF FIG. 2B | | |
|---|---|---|---|---|---|
| Prefix | Kernel | Decoded | Prefix | Kernel | Decoded |
| 1110 | 1 | A | 10 | 11 | A |
| 1110 | 0 | B | 10 | 10 | B |
| 1111 | — | C | 10 | 0 | C |
| 110 | — | D | 110 | — | D |
| 10 | — | E | 111 | — | E |
| 0 | — | F | 0 | — | F |

It is now seen that, in the tree as shown in FIGS. 5A and 5B, a bit in the prefix corresponds to movement along the upper line of the tree and a bit in the kernel corresponds to movement down the tree.

FIG. 7 shows a schematic diagram of a decoding system according to a preferred embodiment of the invention. The code is fed via an input 140 to a counter 142. Counter 142 also receives, via input C, an indication of the maximum number of bits in the prefix of coded signal. Counter 142 is configured to count the number of bits in the prefix of the code. Thus, for the code system which has been described above, counter 142 counts the number of ones and the first 0.

When the counter reaches either the end of the prefix or one less than the maximum length of the prefix, it sends a token to the input of kernel decoder 144, immediately after the end of $\phi_1$. The counter also outputs a prefix length signal "A" at output 145. The nodes in kernel decoder 144 are fed with values of D by memory 146 and with code by interface 148. The values of D which are used to decode any particular kernel are dependent on the particular tree code with which the information is coded and the number of bits in the prefix of the particular code word being decoded.

Memory 146 receives the prefix length "A" via an input 150 and information regarding the code "B" from an external source via an input 152. Based on this information, memory 146 sends D signals to the nodes such that kernel decoder 144 optimally decodes the input word. In general the values of D and the decoding tables used are already in place when the token is generated. This is assured by providing a change of values with each count of $\phi_1$. In general, when the "A" signal is received, the current values are frozen. When the prefix length is a maximum, the table values are changed to the next table.

After the token passes through kernel decoder 144 it reaches one of the input terminals 158–165 of memory 154 which, using the value "A" and code information "B," uses a translation table to provide a decoded signal at an output 156. Memory 154 also provides a reset signal to the counter preferably immediately when it receives the token, so that the counter is reset for the next coded word.

The operation of the embodiment of FIG. 7 will be more easily understood by applying the examples of FIG. 2. It will be noted that the nodes of kernel decoder 144 of FIG. 7 have been marked with reference letters. Table II contains values of D for each node for different prefix lengths. Table III shows the decoding tables for memory 154 for different prefix lengths. Note that, where the prefix length is equal to the maximum length, the token enters the decoder at the last count of the maximum prefix length.

TABLE II-D

| | VALUES | | | | | | | | | | | | |
|---|---|---|---|---|---|---|---|---|---|---|---|---|---|
| | CODE OF FIG. 2A | | | | | | | CODE OF FIG. 2B | | | | | |
| Prefix Length | t | u | v | w | x | y | z | Prefix Length | t | u | v | w | x | y | z |
| 1 | * | * | * | 1 | * | 1 | 1 | 1 | * | * | * | 1 | * | 1 | 1 |
| 2 | * | * | * | 1 | * | 1 | 1 | 2 | 1 | 1 | * | 1 | 0 | 1 | 0 |
| 3 | * | * | * | 1 | * | 1 | 1 | 3 | * | 1 | * | 1 | 1 | 1 | 0 |
| 4 | * | 1 | 1 | 1 | 1 | 0 | 0 | | | | | | | | |

TABLE III

DECODING TABLES

| Prefix Length | Tree Decoder Output | | | | | | | |
|---|---|---|---|---|---|---|---|---|
| | 158 | 159 | 160 | 161 | 162 | 163 | 164 | 165 |
| CODE OF FIG. 2A | | | | | | | | |
| 1 | * | * | * | * | * | * | * | F |
| 2 | * | * | * | * | * | * | * | E |
| 3 | * | * | * | * | * | * | * | D |
| 4 | * | * | * | C | * | A | * | B |
| CODE OF FIG. 2B | | | | | | | | |
| 1 | * | * | * | * | * | * | * | F |
| 2 | * | A | * | B | * | * | * | C |
| 3 | * | * | * | E | * | * | * | D |

The decoder of FIG. 7 can thus accommodate both the codes of FIGS. 2A and 2B using only 7 nodes rather than the 31 nodes of the embodiment of FIG. 4. Further, The memories of the circuit of FIG. 7 are smaller and have fewer ports than those of circuit of FIG. 4. The supporting circuitry of FIG. 7 is somewhat mode complicated then that of FIG. 4, however, for larger codes, the savings in number of nodes far offsets the extra complexity of the supporting circuitry.

The invention has been described above for the example of serially received Hufman codes in which the bits of code are. received sequentially. The present invention is equally applicable to cases in which the code is received in parallel. i.e., at the same time. The embodiment shown in FIG. 8, is similar to that of FIG. 7 except that counter 142 is replaced by partition circuit 170 which receives the Hufman code via parallel inputs 172. The partition circuit determines, from the code which is received, the length of the prefix and immediately sends this information to memories 146 and 154 which operate in much the same way as in the embodiment of FIG. 7. However, the code is applied to kernel decoder in parallel by a kernel interface 174 rather than in series. The first bit of the kernel is applied to the uppermost level of decoder 144, the second bit to the second level, etc. Furthermore, in the circuit of FIG. 3B, $\phi_1$ is preferably replaced by a constant high signal or more preferably the circuit of FIG. 9, described below, is used for the nodes of FIG. 8. In either case, the circuit of FIG. 7 does not pass the token down kernel decoder 144, one level per clock, but is operative to pass the token immediately to the proper output port for generation of the uncoded word.

Since the parallel code in many cases does not fill an entire word of the parallel transmission (and one transmission word includes more than one code word) or alternatively may be contained in more than one word, partition circuit 170 preferably contains a buffer memory which allows for reconstructing entire code word from the fragmented words received by the partition circuit.

The node circuit shown in FIG. 8 does away with the need for gates 118, 100' and 102' and buffers 104', 106', 112' and 114'. The node operates to perform the same function as the node of FIG. 3B, however, it passes the token through the node without the delay associated with (and necessary for) the serial decoder.

It is understood that the embodiment of FIG. 4 can be easily modified to operate in a parallel manner in accordance with the principles of the embodiment of FIGS. 7 and 8.

While the circuitry of the preferred embodiments of the invention is shown in simplified form, the actual circuitry used may be more complex. For example, the memories used to store the D values and the decoding tables will normally include addressing circuitry, driving circuitry and interfaces, of a type well known in the art.

While the invention has been described in conjunction with the preferred embodiments of the invention, the description of these embodiments is meant to be descriptive rather than limiting and the scope of the invention is limited only by the following claims:

I claim:

1. Apparatus for decoding information which has been coded with a tree code comprising:
   a tree decoder including:
   a tree input port at which a token enters the tree decoder;
   a plurality of tree output ports from one of which the token exits the tree decoder; and
   a plurality of nodes forming a tree connected between the tree input port and the tree output ports, each of the nodes comprising:
   an token input port;
   two token output ports;
   a code input port; and
   means for operating the node in a first mode wherein the token passes from the token input port to one of the token output ports in response to the code input and a second mode wherein the token passes from the input port to one of the output ports independent of the code output.

2. Apparatus according to claim 1 wherein the decoder operates according to a cycle time and wherein, in the first mode of operation, the token passes through the node in one cycle time and wherein, in the second mode of operation the token passes through the node in a period substantially less than one cycle time.

3. Apparatus according to claim 1 wherein the decoder receives the code in parallel form and where the token passes through node substantially without delay.

4. Apparatus according to claim 1 and also including means for generating a decoded signal responsive to the particular tree output at which the token exits the tree decoder.

5. Apparatus according to claim 4 wherein the means for generating includes means for producing the decoded signal in response to the particular tree code used to code the information.

6. Apparatus according to claim 4 wherein the means for generating comprises:
   at least one table for determining the decoded signal; and
   means for choosing the table responsive to the particular tree code used to code the information.

7. Apparatus according to claim 6 wherein the coded information is in the form of a first series of bits of a given value optionally concluded by one bit of the other value followed by a second series of bits and also including means for determining the number of bits in the first series and wherein the means for choosing is also responsive to the number of bits in the first series.

8. Apparatus according to claim 4 wherein the coded information is in the form of a first series of bits of a given value optionally concluded by one bit of the other value followed by a second series of bits and also including means for determining the number of bits in the first series, and wherein the means for generating includes means for producing the decoded signal in response to the particular tree code used to code the information and the number of bits in the first series.

9. Apparatus according to claim 8 wherein the means for operating includes means for providing separate control signals to each of the plurality of nodes whereby the node are selectively operated in the first or second modes and wherein the means for providing includes means for producing the separate control signal responsive to the particular tree code used to code the information and to the length of the first series.

10. Apparatus according to claim 1 wherein the means for operating includes means for providing separate mode control signals to each of the plurality of nodes whereby the nodes are selectively operated in the first or second mode.

11. Apparatus according to claim 7 wherein the means for providing includes means for producing the separate mode control signal responsive to the particular tree code used to code the information.

12. Apparatus according to claim 11 wherein the coded information is in the form of a first series of bits of a given value optionally concluded by one bit of the other value followed by a second series of bits and also including means for determining the number of bits in the first series and wherein the means for producing is also responsive to the number of bits in the first series.

13. Apparatus according to claim 1 wherein the coded information is in the form of a first series of bits of a given value optionally concluded by one bit of the other value followed by a second series of bits and also including means for determining the number of bits in the first series.

* * * * *